United States Patent [19]

Petersen

[11] 4,439,858

[45] Mar. 27, 1984

[54] DIGITAL IN-CIRCUIT TESTER

[75] Inventor: Gerald W. Petersen, Walnut Creek, Calif.

[73] Assignee: Zehntel, Inc., Walnut Creek, Calif.

[21] Appl. No.: 267,734

[22] Filed: May 28, 1981

[51] Int. Cl.³ .................. G01R 31/28; G06F 11/00
[52] U.S. Cl. .................................. 371/20; 371/27; 324/73 AT
[58] Field of Search ...... 364/200 M.S. File, 900 M.S. File; 324/73 R, 73 AT, 73 PC; 371/15, 20, 27

[56] References Cited

U.S. PATENT DOCUMENTS

| | | | |
|---|---|---|---|
| 3,832,535 | 8/1974 | De Vito | 324/73 AT X |
| 3,922,537 | 11/1975 | Jackson | 324/73 R |
| 4,055,801 | 10/1977 | Pike et al. | 371/20 X |
| 4,216,539 | 8/1980 | Raymond et al. | 371/20 |
| 4,290,137 | 9/1981 | Hilker | 324/73 AT |
| 4,291,404 | 9/1981 | Steiner | 324/73 AT |
| 4,339,819 | 7/1982 | Jacobson | 371/20 |
| 4,348,759 | 9/1982 | Schnurmann | 371/20 |

*Primary Examiner*—Eddie P. Chan
*Attorney, Agent, or Firm*—Arnold, White & Durkee

[57] ABSTRACT

A circuit adapted for use in a high speed computer controlled digital in-circuit tester for obtaining high pulse fidelity at each electrical node of a circuit under test is provided. High pulse fidelity is obtained by minimizing the current in the power supply and digital test signal current loops for the components of the circuit under test. The tester includes a plurality of programmed memory digital test-signal generators responsive to the computer for generating and supplying to the nodes of the circuit under test a complex sequence of digital logic signals. The circuit also includes a plurality of distributed programmable power sources, each power source associated with at least one of said test signal generators, for generating the power supply voltages for the components. The power supply voltages for the components under test are obtained from the programmable power sources associated with the test signal generators involved in generating and supplying the test signals to those components, thereby localizing the component power supply current loops and the driving digital test signal current loops.

7 Claims, 6 Drawing Figures

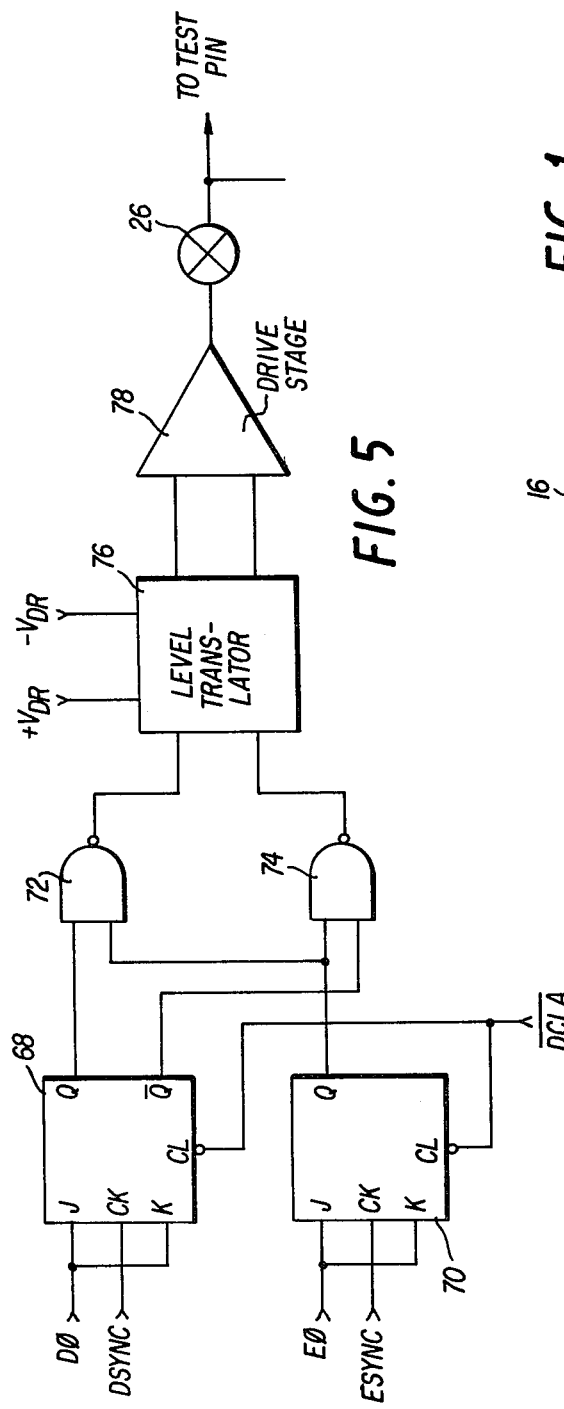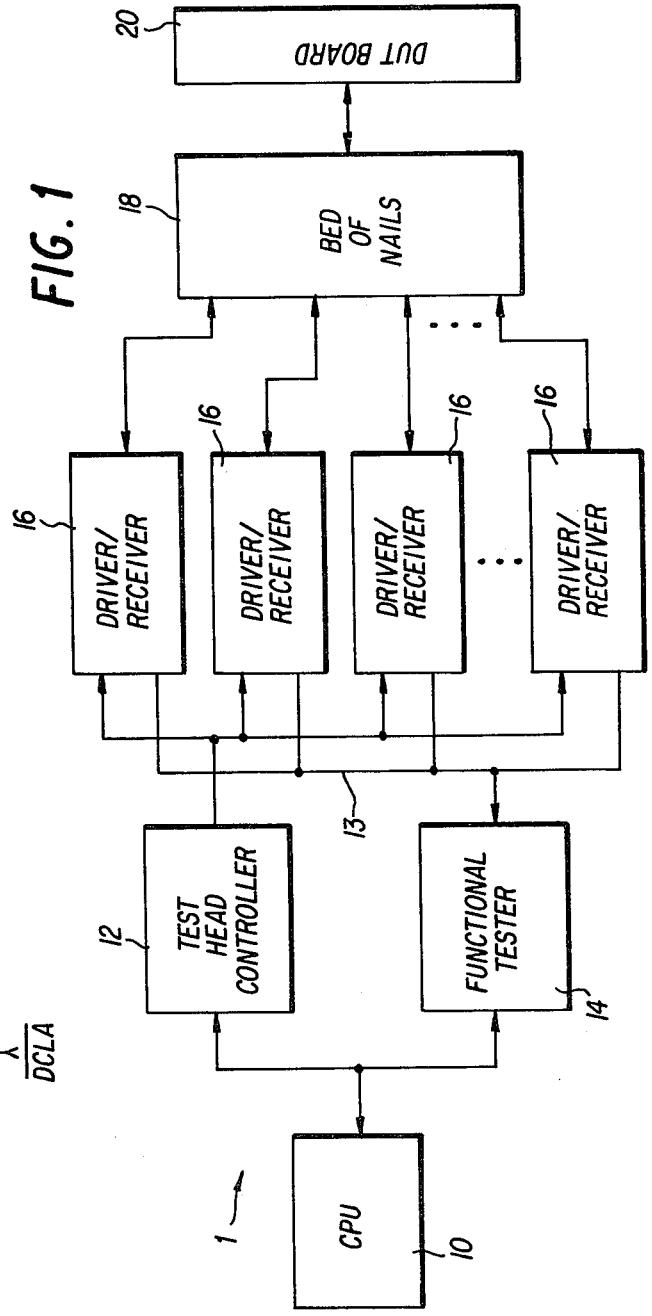

DIGITAL IN-CIRCUIT TESTER

BACKGROUND OF THE INVENTION

This invention relates to automatic digital in-circuit testing systems. More particularly, the invention relates to a digital in-circuit tester capable of testing high speed logic devices, such as ECL logic.

Prior-art digital in-circuit testers suffer from several disadvantages. Logic designers have discovered that in certain applications, such as computer main frames, etc., a physically large printed circuit board with as many as 3,000 circuit nodes is less expensive to produce and more reliable in operation. With these larger boards, there has been an increase in the mixture of logic families, i.e., TTL, MOS and ECL devices. Designers are becoming increasingly adept at using whatever devices best meet their speed and performance requirements, rather than using just one logic family for the sake of expediency. Because of its exceptionally high speed ECL logic is being used more and more along with the more common TTL and CMOS devices.

The output voltage swing for an ECL logic device is typically between −1.6 v for logic 0 and −0.8 v for a logic 1. Because of the small voltage swing (0.8 v) between logic 0 and logic 1 and their speed, ECL devices are particularly difficult to test. Prior-art testers have been unable to test ECL devices effectively because they cannot provide the proper logic power supplies, nor can they handle ECL's high slew rates and high sensitivity to noise. The amplitudes of signal abberations, such as "ringing" and "overshoot" usually acceptable in testing TTL, are unacceptable for testing ECL devices. A ringing signal which would look like a logic 1 to a TTL device may look like a bit stream to an ECL device.

Three factors which may negatively affect an ECL test are node driver line impedance, power supply interconnection impedance, and slew rate of the drive signal. To understand the affects, consider the following simplified equation for voltage drop across an interconnection path:

$$e = L(di/dt) + iR.$$

Both components of the equation, i.e., L (di/dt) and iR, affect voltages both on the node-driver line (AB in FIG. 3) and on the power supply current return line (CD in FIG. 3). On the node-driver lines, the DC component (iR) is relatively small because the short path has low resistance. However, the AC component (L di/dt) can be significant. This is especially true in the case of ECL devices where high slew rates make (di/dt) unavoidably large.

On the supply current return path of prior-art testers, the DC effects are most significant because of the long path (CD in FIG. 3(a)) from the device under test to the point where the response is measured. The current (i) is high because the return line is connected to the system ground bus which carries power supply current for the entire board as well as the node driver return currents. The return line therefore has a large iR noise component. This kind of noise is called "ground shift." With 10-gauge copper wire (adequate for most prior-art testers), a typical value of this ground shift is on the order of 400 mv.

With this amount of ground shift, prior-art board testers are still able to test TTL and CMOS, because 400 mv of offset is a small amount compared to the voltage swings of these devices. However, 400 mv of noise is unacceptable for ECL testing because this amount of ground shift is fully half the proper voltage swing. A ground shift this large will yield erroneous test results.

The AC noise component, L (di/dt), causes further problems, "overshoot" and "ringing." This is an especially troublesome problem with the node driver line (AB FIG. 3). Uncontrolled overshoot can actually destroy devices, especially CMOS, and ringing introduces transients that can exceed logic voltage thresholds resulting in false triggerings and incorrect device response measurements.

A further problem of prior-art in-circuit digital testers is the inability to handle multi-logic testing easily. Prior-art in-circuit testers used a power supply and driver/receiver cards configured as shown in FIG. 3 (a). The 0 v and 5 v power supply and logic voltages shown are appropriate for testing most TTL devices. But if a printed circuit board also contains CMOS and/or ECL devices, this configuration will not work. For example, to test a CMOS device operating between 0 and 12 volts, a different power supply would have to be connected to the board, and on most prior-art testers this has necessitated custom rewiring of the system or the bed-of-nails test fixture through which the power is applied to the board. For a CMOS device operating between −5 v and +5 v, two power supplies would have to be used. Most prior-art testers cannot provide two non-zero voltages, even with rewiring. This limitation is even more severe when it comes to testing ECL devices, for here the power supply voltages are not the same as the logic voltages. ECL power supply voltages are −5.2 v and 0 v, while the logic voltages are −1.6 v for logic 0 and −0.8 v for logic 1.

Therefore, it would be advantageous to provide an automatic digital in-circuit tester which is able to minimize both the noise in the test signals as they appear at the nodes of the printed circuit boards and the ground shift due to the board power supply current loops, thereby significantly reducing the kind of test signal distortion that can damage devices, produce false triggering, or create erroneous measurements.

SUMMARY OF THE INVENTION

In accordance with the invention, an automatic digital in-circuit tester adapted for use with a computer for testing the electrical properties of components in a circuit under test is provided. The components of the circuit under test are interconnected at electrical nodes, and operate from at least one reference power supply voltage. The invention includes a bed-of-nails test fixture having a plurality of test pins for contacting the electrical nodes of the circuit under test. A controller responsive to the computer is provided for controlling the generation of the test sequence in which a sequence of digital test signals are generated and applied to the circuit under test to obtain a response signal. At least one sensing means is provided for performing tests on the response signal to determine the electrical properties of the circuit under test.

A plurality of digital driver/receiver circuits responsive to the controller and the computer is provided for supplying a sequence of digital logic signals to the test pins, and for receiving the response signals from the circuit. Distributed among the driver/receiver circuits is a plurality of selectable, programmable reference power sources for generating the power supply operating voltages for the components of the circuit. The driver/receiver circuits selectively connect their associated reference power sources to the bed-of-nails test fixture whereby the reference power supply current loops and driving digital test signal current loops for testing a component of the circuit are localized to the driver/receiver circuits involved in the test.

Each driver/receiver circuit includes a programmed memory digital test-signal generator responsive to the controller and the computer for supplying the sequence of digital logic signals to an associated test pin. Also included is a selectable switch means which (1) connects an associated test pin to a response signal line, (2) connects an associated digital test-signal generator to its associated test pin and (3) connects an associated reference power source to test pins in the bed-of-nails test fixture. A switch selector means responsive to the computer is provided for controlling the selectable switch means to connect at least one said digital test-signal generator to a node of the circuit under test and for connecting at least one node of the circuit under test to a response signal line.

Each selectable programmable reference power source includes a programmable storage means for storing digital voltage control codes representative of a DC voltage control signal. A digital-to-analog convertor is provided for converting the digital control code signals to the DC voltage. A series regulator responds to the DC control voltage for regulating a system power supply voltage to obtain one reference power source operating voltage.

BRIEF DESCRIPTION OF THE DRAWINGS

For a fuller understanding of the invention, reference should be added to the following detailed description taken in connection with the accompanying drawings, in which:

FIG. 1 is a block diagram of the in-circuit tester of the present invention;

FIG. 5 is a circuit diagram for the logic level generating circuits for each digital test-signal generator included in a driver-receiver circuit.

Similar reference numbers refer to similar components throughout the drawings.

DETAILED DESCRIPTION OF THE PREFERRED EMBODIMENT OF THE INVENTION

Figure 2:
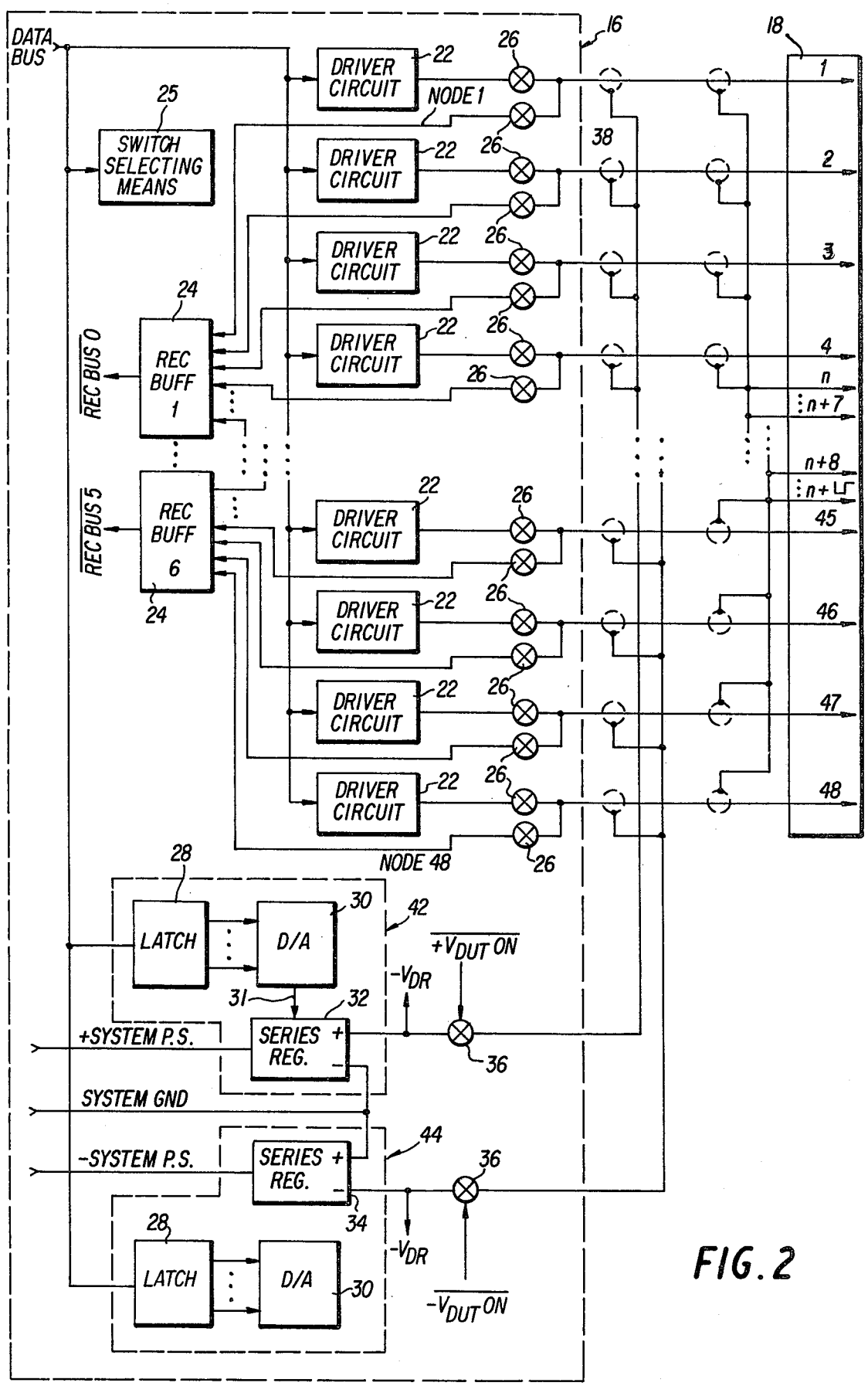
FIG. 2 is a more detailed circuit diagram of a typical driver/receiver board illustrated in FIG. 1.

Referring to the figures and first to FIG. 1 which illustrates a block diagram of the invention, a central processing unit CPU 10 is shown controlling a test head controller 12 and functional tester 14. Test head controller 12 functions to control the internal operations of the tester 1 during a test cycle during which digital test signals are applied to a device under test (DUT) 20 through a bed-of-nails test fixture 18 to test the electrical components of the DUT. The components for the printed circuit board 20 are interconnected at electrical nodes. These nodes are contacted by a plurality of test pins contained in the bed-of-nails fixture 18. Associated with the test pins is a plurality of driver/receiver boards 16 that generate and supply the digital test signals for the device under test, and receive the response signal therefrom.

For the preferred embodiment of the present invention, tester 1 is able to test 48 test pins per driver/receiver board 16, and with 63 boards up to 3,024 electrical nodes. A response signal 13 selected by the tester 1 during each test cycle is inputted to the functional tester 14 from the driver/receiver 16 boards. Functional tests, such as a cyclic redundancy check (CRC) may be performed on the pattern of logic levels on the response signal line 13. The results of the functional test are inputted to the CPU 10 for analysis to determine the electrical properties of the device under test.

In addition to supplying the digital test signals to the device under test, each driver/receiver board 16 contains a power source capable of generating both a positive and a negative voltage for the DUT 20. Each of these power sources is programmable both for the positive and the negative voltages. Programming is accomplished from the CPU 10 via the test head controller 12.

Turning now to FIG. 2 which illustrates a block diagram of a typical driver/receiver board 16, a driver circuit 22 is shown associated with a test pin in the bed-of-nails test fixture 18. Connected between the test pin and its associated driver circuit 22 is a selectable switch 26 selected under CPU 10 control. Also connected to each test pin associated with a driver circuit 22 is a second selectable switch 26 which, when closed, connects the associated test pin to a response signal line. A plurality of receiver buffer circuits 24 are provided for buffering a predetermined number of the response line signals to the functional tester 14. For the preferred embodiment of the invention, 8 test pins are inputted to each receiver buffer 24. There they are multiplexed onto one of 6 signal lines (REC BUS0–REC BUS5).

A switch selecting means 25 connected to the DATA BUS from CPU 10 is used to control the conduction states of the solid state switches 26. While a multiplexing switch 26 is provided for each test pin associated with a driver circuit 22 for multiplexing an output from the DUT 20 to the functional tester 14, it will be appreciated by those skilled in the art that an individual testing circuit could be provided for each test pin for performing the test to determine the electrical properties of the DUT 20 rather than multiplexing each pin onto a single response signal line.

U.S. Pat. No. 4,216,539 issued to the Assignee of the present invention discloses an in-circuit digital tester which generates a complex pattern of logic levels from programmed memory behind each pin in a bed-of-nails test fixture. The present invention incorporates the digital test-signal generation techniques disclosed in U.S. Pat. No. 4,216,539, which disclosure is hereby incorporated for all purposes.

As previously discussed, a simplified equation for the voltage drop across an interconnection path from the output of a driver circuit to a node of the DUT 20 can be expressed as:

$$e = L(di/dt) + iR.$$

The first term of this equation, L (di/dt) is considered the AC noise component of the voltage. This component causes problems in testing certain families of logic devices, such as ECL logic. These problems are called "overshoot" and "ringing." Uncontrolled overshoot can actually destroy devices, especially CMOS. Ringing introduces transients that can exceed logic voltage threshold, resulting in false triggerings and incorrect device response measurements, especially in ECL logic. It is therefore important to minimize the value of L (di/dt). One way is to minimize the (di/dt) component.

This quantity depends both on the slew rate of the logic pulses and on the nature of the load. Decreasing the slew rate (increasing the transition time) will naturally reduce (di/dt), but there is a limit to the effectiveness of this approach. This is because during the linear portion of the voltage transition, an ECL device can act as an amplifier. Thus, to reduce ringing by decreasing the slew rate can actually result in increased noise sensitivity. If a tester is built to test only TTL devices (transition times of approximately 20 ns) or CMOS devices (transition times of approximately 90 ns), the slew rate can be decreased significantly without running into noise amplification problems. But ECL devices are far more sensitive (transition times are approximately 5 ns, and typically 2 ns). For ECL devices, (di/dt) not only is an order of magnitude higher than for the other more common families, but it also must remain so.

The other factor that affects (di/dt), the load at the node being driven on the circuit board, depends on the devices that are connected to that node. These devices introduce capacitance and resistance at the node being driven. The resistances, and especially the capacitances contribute to overshoot and ringing, and there is no way to reduce their value. The load caused by the devices on the board is a function of the design of the board. Thus, the only way to reduce the (di/dt) component is to reduce the slew rate. For ECL devices, this is not feasible. In fact, with most prior-art testers the main problem is the inability to operate at a high enough slew rate without causing false results due to overshoot and ringing.

The present invention solves the problem of overshoot and ringing in testing ECL devices, not by reducing (di/dt), but by reducing the effect of the inductance L. This is accomplished by using coaxial cables. The center conductor of the cables serve to connect the node driving circuits 22 to the test pins in the bed-of-nails test fixture 18. As shown in FIG. 2, each output from switch 26 connected to the output of a driver circuit 22 is connected to a test pin in the bed-of-nails test fixture 18 through the center conductor (38) of a coaxial cable. For the present invention, the cable shield serves double duty, as shielding and as power supply wiring to supply reference power supply voltages for the device under test.

Still referring to FIG. 2, each of the driver/receiver boards 16 contain a programmable power source 42, 44 for supplying both a positive voltage $+V_{DUT}$ and a negative voltage $-V_{DUT}$ to power components of the DUT 20. The positive voltage supply 42 for generating the $+V_{DUT}$ consists of a latch 28 responsive to the DATA BUS signals for storing digital code signals representative of a DC reference control voltage. A digital-to-analog convertor 30 responds to the output of latch 28 to produce the DC reference control voltage (31 for $+V_{DUT}$). This control voltage 31 is applied to a series regulator 32 to produce a regulated voltage $+V_{DR}$ on its output. The +system P.S. is inputted to regulator 32, and is regulated in response to the control voltage 31. The output of regulator 32 ($+V_{DR}$) is applied to a selectable switch 36 that responds to the control signal $\overline{+V_{DUT}ON}$ to apply the output of the voltage supply 42 to a plurality of the bused together shields of several cables connecting the driver circuits 22 to the test pins of the bed-of-nails fixture 18.

Figure 3A:
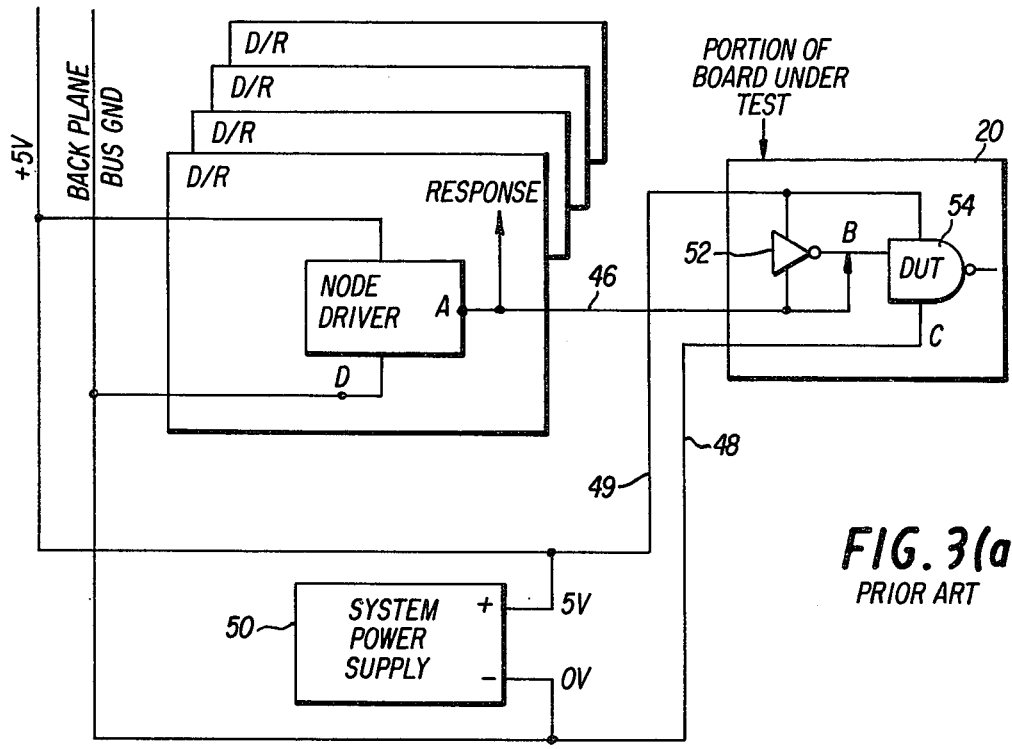
FIG. 3(a) is a block diagram of a typical prior-art in-circuit digital tester illustrating the power supply current loops and driving digital-test signal current loops for a component under test.

FIG. 2 illustrates that 24 shields of 24 coaxial cables are connected together to carry the current for the one reference voltages ($+V_{DUT}$) to the bed-of-nails fixture 18. Similarly $-V_{DUT}$ is applied through 24 shields. At the bed-of-nails test fixture 18, these 24 shields are distributed to 8 test pins for application to the nodes of the DUT 20. By proper selection of the test pins, the appropriate nodes of the components of the DUT 20 can be powered so as to localize the power supply current loops and the driving digital test signal current loops to the components of the DUT 20 that are being driven by the associated driver/receiver card 16 (see FIG. 3(a)). The operation of the negative power supply 44 is identical to that of the positive power supply 42. Selectable switch 36, one connected to the output of each power supply 42, 44, is used to selectively connect the output from the power source 42, 44 to the bed-of-nails test fixture 18 under control of controller 12.

Turning now to FIG. 3 (a), a block diagram of the driver/receiver card and power supply interconnection for testing a device under test 20 is shown. For this prior-art arrangement, the ground power supply current return path for the DUT 20 (CD) is from the DUT 20 to the power supply 50 and the BACKPLANE GROUND BUS. For this DC return path, the current i is high because the return line is connected to the system ground bus which carries power supply current for the driver/receiver boards, as well as the node drive test signal return currents. The return line CD therefore has a large iR noise component.

This kind of noise is called "ground shift." With 10-gauge copper wire, the value of this ground shift is on the order of 400 mv. This figure for the ground shift is calculated as follows: The resistance of 10-gauge copper wire is equal to one milliohm per/ft. A typical length of return patch CD is 5 ft., giving 5 milliohms of resistance for R. To this value add approximately 15 milliohms of total contact resistance (test pins to electrical nodes, card edge connector pins, etc.) to obtain R = 20 milliohms. Thus, 20 milliohms times 20 amps (a typical ground bus current) equals 400 millivolts. Even with this amount of ground shift, board testers are still able to test TTL and CMOS, because 400 mv of offset is a small amount compared to the voltage swings of these devices. However, in ECL logic, 400 millivolts is half the voltage swing. A ground shift this large would yield erroneous readings.

Figure 3B:
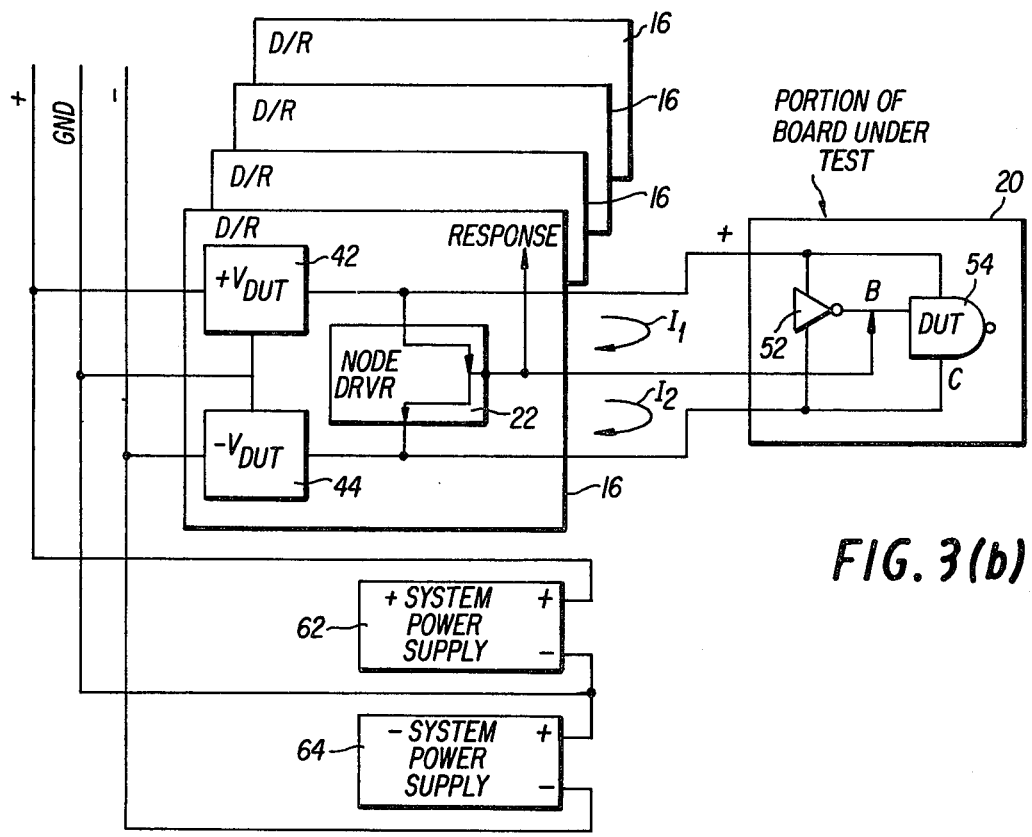
FIG. 3(b) is a block diagram of the present invention illustrating the power supply and digital test signal current loops for the device under test.

Turning now to FIG. 3(b) which illustrates the distributed power supply configuration of the present invention, system power supplies 62 and 64 are shown distributed to each of the plurality of driver/receiver cards 16. As previously discussed, each driver/receiver card 16 contains a $+V_{DUT}$ regulator 42 and a $-V_{DUT}$ regulator 44 for respectively regulating the plus and minus system power supply voltages to obtain reference power supply voltages for the DUT 20.

Also shown in FIG. 3(b) are the current paths for a typical driver circuit 22 and the reference power supply which provides operating voltages to the components of the DUT 20 that are being tested by that driver/- receiver card. A typical test configuration is shown in FIG. 3(b) in which the output of a driver circuit 22 is applied to a node B interconnecting the output of an invertor 52 to the input of a two input NAND gate 54. The positive voltage supply for the invertor 52 and the NAND gate 54 is provided by the $+V_{DUT}$ voltage regulator 42 on the driver/receiver card containing the driver circuit 22 driving node B. Similarly, the 0 voltage reference power level $-V_{DUT}$ is connected to invertor 52 and NAND gate 54 from regulator 44. Two current loops are also illustrated in FIG. 3(b), $I_1$ and $I_2$.

When driver circuit 22 is supplying a logic high to the DUT 20, current flow is from the output A of driver circuit 12 to the node B, returning through lead CD. When driving a logic 0, the current flow is from the $+V_{DUT}$ supply 42 to the DUT 20, back to the driver circuit 22 via BA, and on through the driver circuit 22 to point D. Thus, for the components of DUT 20 being tested, the reference power supply and the digital test signal current loops are localized to the driver/receiver card involved in the generation of the test signals applied to the components. For the present invention, the current flowing in the system GND does not appear in the ground return paths for the components under test of DUT 20.

Figure 4:
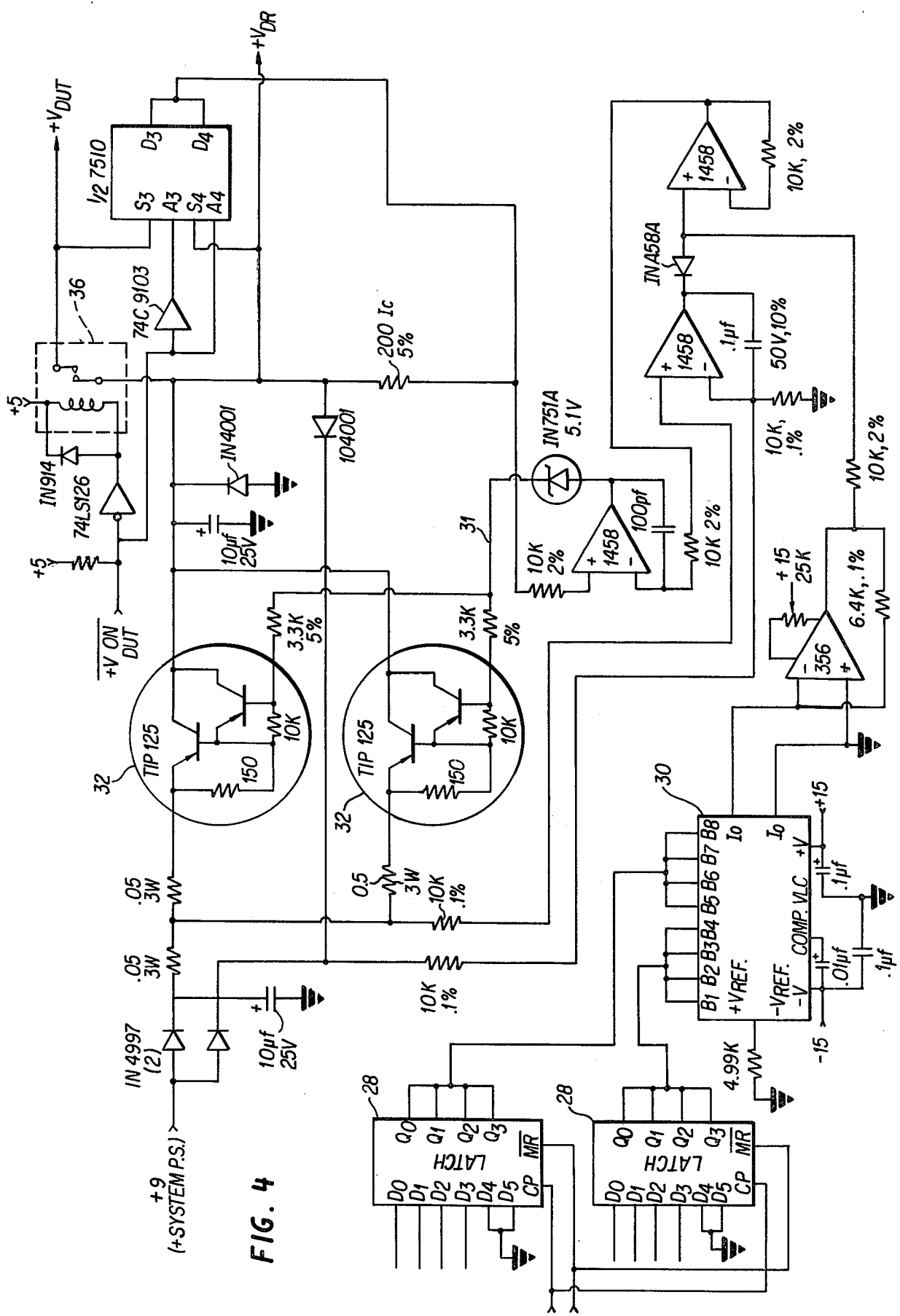
FIG. 4 is a detailed circuit diagram of the positive voltage portion of a reference power source illustrated in FIG. 2.

Turning now to FIG. 4, a more detailed circuit diagram of the $+V_{DUT}$ regulator 42 is shown. Latches 28 are shown responding to the digital signals of the DATA BUS from the CPU 10 for storing digital code words representative of a DC reference control voltage 31 to be generated. Responding to the output of latches 28 is a D/A convertor 30 which converts the digital code words to a DC control voltage. This voltage appears on a signal lead 31 connected to the series pass regulators 32. Regulators 32 regulate the + System Power Supply (+9 V) to produce the signal $+V_{DR}$. This voltage is then applied to a selectable switch 36. When switch 36 is selected by the signal $+V_{DUT}ON$, the voltage $+V_{DR}$ is applied to the output of the driver/receiver card 16 as $+V_{DUT}$. It will be appreciated by those skilled in the art having the benefit of the disclosure of FIG. 4 how the regulator circuits of FIG. 4 operate, and a detailed description of the circuit will not be provided. In a presently preferred embodiment of the invention used in connection with a driver/receiver card for powering a limited number of components of a device under test, the various circuit components and voltages depicted in FIG. 4 have been found satisfactory.

Turning now to FIG. 5, a portion of each driver circuit 22 which converts the data from each programmed-memory in a digital test-signal generator (see U.S. Pat. No. 4,216,539, incorporated herein by reference) is shown. The output from gates 72 and 74 are applied to a level translator 76 for converting the unipolar voltage swings of the logic gates 72, 74 to voltage swings which can go both positive and negative. The output of level translator 76 is applied to the current drive stage 78 for generating the drive signal appropriate for driving an in-circuit electrical node. Except for the function of level translation, the operation of the circuits illustrated in FIG. 5 are identical to that disclosed in U.S. Pat. No. 4,216,539.

Further modifications and alternative embodiments of the apparatus of this invention will be apparent to those skilled in the art in view of this description. Accordingly, this description is to be construed as illustrative only and is for the purpose of teaching those skilled in the art the manner of carrying out the invention. It is to be understood that the forms of the invention herewith shown and described are to be taken as the presently preferred embodiments.

What is claimed is:

1. A digital in-circuit tester adapted for use with a computer for testing the electrical properties of components interconnected at electrical nodes in a circuit under test, and where the components operate from at least one reference power supply voltage, the tester having at least one response line connectable to one of the electrical nodes of the circuit under test, comprising:
   (a) a bed-of-nails test fixture having a plurality of test pins for contacting the electrical nodes of the circuit under test;
   (b) a controller responsive to the computer for controlling the generation of the test sequence in which a sequence of digital test signals are generated and applied to test pins connected to the circuit under test and a response signal obtained therefrom on a connected response signal line;
   (c) a functional tester operatively coupled to said computer and responsive to the response signal on said connected response signal line for performing tests on said response signal to determine electrical properties of the circuit under test; and
   (d) a plurality of digital driver/receiver circuits responsive to said controller for supplying the digital test signals to the test pins and for receiving a response signal from the circuit, each driver/receiver circuit programmable to supply one of said digital test signals to the circuit under test, said driver/receiver circuits having
      (i) a distributed plurality of selectable, programmable reference power supplies, each said power supply associated with at least one of said driver/receiver circuits, for generating the reference power supply operating voltages for components of the circuit under test to receive test signals from the associated driver/receiver circuits,
      (ii) a plurality of selectable switch means responsive to said computer for selectively connecting said driver/receiver circuits and said programmable power supplies to test pins in said bed-of-nails test fixture, said plurality of selectable switch means selectively connecting a node of the circuit under test to a response signal line,
      (iii) each said programmable power supply in said plurality of power supplies, when connected by said plurality of switch means to the circuit under test, defining a power supply current loop therebetween for conducting power supply current to and from the circuit under test, and
      (iv) each said driver/receiver circuit, when conected by said plurality of switch means to a node of the circuit under test, defining driving digital test signal current loops, each test signal current loop including a portion of said power supply current loop,
   (e) said driver/receiver circuits selectively connecting their associated said referenced programmable power supplies to said bed-of-nails fixture so that the currents in said referenced power supply current loops and said digital test signal current loops for testing a component are isolated from the currents in any other said power supply and digital signal test signal current loops, and thus localized to the driver/receiver circuits involved in testing the component.

2. The tester of claim 1 wherein each said driver/receiver circuit includes:
 (a) a programmed memory digital test-signal generator responsive to said controller for supplying one digital test signal to an associated test pin; and
 (b) one said selectable switch means responsive to said computer for connecting the associated test pin
  (i) to a response signal line, or
  (ii) to said associated digital test-signal generator.

3. The tester of claim 2 further including a switch selecting means responsive to the computer for controlling each said selectable switch means to
 (a) connect at least one digital test-signal generator to a node of the circuit under test,
 (b) connect at least one node of the circuit under test to a response signal line, and
 (c) connect at least one of said plurality of programmable reference power supplies to test pins in said bed-of-nails test fixture so that the components in said circuit under test responding to said connected digital test-signal generators are powered from said test pins connected to said connected programmable power supplies.

4. The tester of claim 1 wherein the tester operates from at least one system power supply voltage, and wherein each said selectable programmable power source includes:
 (a) programmable storage means for storing voltage level control signals representative of a DC voltage control level to be generated;
 (b) a digital-to-analog convertor for converting the voltage level control signals to the DC voltage control signal; and
 (c) a series regulator responsive to the DC voltage control signal for regulating one of the system power supply voltages to obtain one reference power supply operating voltage of the circuit under test.

5. The tester of claim 1 wherein the reference power supply voltages are applied to the components of the circuit under test through a plurality of test pins in said bed-of-nails test fixture.

6. The tester of claim 1 wherein each said driver/receiver circuit applies its sequence of digital logic level signals to its associated test pin through a coaxial cable.

7. A circuit adapted for use in a high speed computer controlled digital in-circuit tester for obtaining high pulse fidelity at electrical nodes interconnecting components of a circuit-under-test, the tester including,
 (A) a plurality of programmed memory digital test-signal generators responsive to the computer for generating and supplying to selected nodes of the circuit-under-test digital test signals, and
 (B) a bed-of-nails test fixture having test pins for contacting said nodes, each said test pin having an associated test-signal generator,
 (C) a switch means responsive to the computer for selectively connecting said test pins to their associated test-signal generator,
the circuit comprising:
 (a) a plurality of distributed, selectable, programmable power supplies, each power supply associated with at least one of said test-signal generators, for generating power supply voltages for components of the circuit-under-test, said switch means responsive to said computer selectively connecting said programmable power supplies to test pins in said bed-of-nails test fixture,
 (b) each said power supply in said plurality of power supplies, when connected to the circuit under test, defining a power supply current loop therebetween for conducting power supply current to and from the circuit under test,
 (c) each said test-signal generator, when connected to a node of the circuit under test, defining driving digital test signal current loops, each test signal current loop including a portion of said power supply current loop associated with said test-signal generator, the power supply voltages for a component-under-test obtained from said programmable power source associated with said test-signal generators involved in generating and driving digital test signals to the component thereby localizing and isolating from any other current loops the currents in the component power supply loop and the driving digital test signal current loops involved in testing the component.

* * * * *